United States Patent [19]

Goetz et al.

[11] Patent Number: 5,407,506
[45] Date of Patent: Apr. 18, 1995

[54] REACTION BONDING THROUGH ACTIVATION BY ION BOMBARDMENT

[75] Inventors: George G. Goetz, Ellicott City; Warren M. Dawson, Baltimore, both of Md.

[73] Assignee: AlliedSignal Inc., Morris Township, Morris County, N.J.

[21] Appl. No.: 241,949

[22] Filed: May 12, 1994

Related U.S. Application Data

[63] Continuation of Ser. No. 894,142, Jun. 4, 1992, abandoned.

[51] Int. Cl.$^6$ .............................................. B32B 31/00
[52] U.S. Cl. ............................ 156/153; 156/272.2; 156/372; 148/DIG. 12; 427/527; 427/539
[58] Field of Search ............... 156/153, 272.2, 281, 156/273.9; 148/DIG. 12, DIG. 22, DIG. 83, DIG. 135; 437/974; 427/527, 539, 573

[56] References Cited

U.S. PATENT DOCUMENTS

| H1164 | 4/1993 | Wade, Jr. et al. | 156/272.6 |
|---|---|---|---|
| 3,679,985 | 7/1972 | Fang et al. | 330/4.6 |
| 4,170,662 | 10/1979 | Weiss et al. | 427/38 |
| 4,274,483 | 6/1981 | Cottone et al. | 165/153 |
| 4,345,985 | 8/1982 | Tohda et al. | 204/192 |
| 4,457,972 | 7/1984 | Griffith et al. | 156/272.2 |
| 4,458,346 | 7/1984 | Mitsuyu et al. | 369/126 |
| 4,547,432 | 10/1985 | Pitts et al. | 428/448 |
| 4,576,865 | 3/1986 | Akao | 156/244.11 |
| 4,638,552 | 1/1987 | Shimbo et al. | 156/273.9 |
| 4,765,860 | 8/1988 | Ueno et al. | 156/272.6 |
| 4,824,008 | 4/1989 | Luszcz et al. | 228/121 |
| 4,849,247 | 7/1989 | Scanlon et al. | 156/272.2 |
| 4,884,737 | 12/1989 | Newkirk et al. | 228/121 |
| 4,886,681 | 12/1989 | Clabes et al. | 427/38 |
| 4,917,843 | 4/1990 | Gyarmati et al. | 264/60 |
| 4,957,771 | 9/1990 | Enloe | 427/38 |
| 4,960,736 | 10/1990 | Luxzcz et al. | 501/127 |
| 4,983,251 | 1/1991 | Hasima et al. | 156/630 |
| 5,008,723 | 4/1991 | van der Have | 357/23.7 |
| 5,010,036 | 4/1991 | Calviello et al. | 437/173 |
| 5,232,870 | 8/1993 | Ito et al. | 148/DIG. 12 |

FOREIGN PATENT DOCUMENTS

3-91227 4/1991 Japan ................. 148/DIG. 12

OTHER PUBLICATIONS

Rossnagel, S. M., *Handbook of Plasma Processing Technology*, Noyes Publications, Park Ridge, N.J., 1990 pp. 206–215.

Lasky et al., Silicon–On–Insulator (SOI) by Bonding and Etch-Back, Proceedings of 1985 IEDM 684.

J. B. Lasky, Wafer Bonding for Silicon-on-Insulator Technologies, Jan. 1986, Applied Physics Letters 48, pp. 78–80.

W. P. Maszara et al., Bonding of Silicon Wafers for Silicon-on-Insulator, Nov. 1988, J. Applied Physics, pp. 4943–4950.

*Primary Examiner*—Chester T. Barry
*Attorney, Agent, or Firm*—Howard G. Massung

[57] ABSTRACT

A method for enhancing the bond energy of reaction bonded surfaces in which polished (10) and cleaned surfaces (12) are bombarded with oxygen ions, fluorine ions or a mixture of oxygen and fluorine ions (14) to activate these surfaces. The activated surfaces are then cleaned to remove particulates (15) and then contacted (16) at room temperature to make a reaction bond therebetween. The reaction bond may be heated (18) to further increase the bond energy. The bond energy of oxygen ion bombarded surfaces can have two times the bond energy of surfaces subject to a conventional bonding process. The addition of fluorine ions to the oxygen ions used to activate the surfaces can further increase the bond energy between the contacted surfaces by at least another factor of 2.

14 Claims, 2 Drawing Sheets

REACTION BONDING THROUGH ACTIVATION BY ION BOMBARDMENT

This is a continuation of application Ser. No. 07/894,142, filed on Jun. 4, 1992, now abandoned.

TECHNICAL FIELD

The invention is related to the field of bonding semiconductor materials, oxides, nitrides and glasses to each other and, in particular, to an improved reaction bonding method which is obtained through surface activation by oxygen and fluorine ion bombardment.

BACKGROUND ART

The ability to create bonds between solid objects has been useful and valuable. There are two basic requirements for achieving useful bonds. First, a sizeable percentage of the atoms on the touching surfaces must be brought into intimate contact with each other and second, the atoms of the touching surfaces must react with each other. Until recent times, the intimate contact required to achieve solid-to-solid reaction bonding could only be achieved when a glass was one of the solids.

In these types of bonds, heat and pressure were used to produce sufficient viscous flow to satisfy the first bonding requirement and undoubtedly the heat energy also promoted the reaction of the atoms of the two surfaces.

The use of an intermediate adhesive layer to bond solid objects together has been a long standing alternative to direct solid-to-solid bonding. The advantage of intermediate adhesives is that these adhesives can have a low viscosity which reduces the requirements on the morphology of the surfaces being bonded or the viscosity of the solid being bonded. Also, the temperature required for the desired surface reaction usually is relatively low. However, adhesives often have a large negative impact on the characteristics of the bonded structure.

In the semiconductor and allied fields where it is desirable and often necessary to maintain the physical and electrical properties of the respective solids at their bonded interface, the use of intermediate adhesives are generally froth with problems and are avoided whenever and wherever possible.

The development of modern semiconductor processing technology has made it possible to produce surfaces smooth enough and clean enough to satisfy the first requirement for solid-to-solid bonding with only elastic deformation of the contacting surfaces. This was first reported by J. B. Lasky et al., 1985 Proceedings IEDM, page 684, for oxidized silicon wafers. This technique permitted the solid-to-solid bonding of semiconductor materials without any problems encountered through the use of an adhesive. A key ingredient of this approach is an initial solid-to-solid bonding at room temperature generally called "contacting." This contacting holds the surfaces in intimate contact with each other in a clean high temperature furnace without the complications and potential contamination encountered when externally applied forces are used to hold the surface together. It was quickly recognized that this technology also had potential for manufacturing sensors with silicon and quartz structures. However, utilization of the full potential of solid-to-solid bonding to create structures with unique combinations of mechanical, electrical, optical and thermal properties has been slow to develop, and in many practical applications, sufficient bond energy was not obtainable.

The invention is an improvement to solid-to-solid reaction bonding having increased bonding strength for a given bonding temperature or the same bond strength for a lower bonding temperature.

SUMMARY OF THE INVENTION

In the method for enhancing the bond energy of solid-to-solid reaction bonding, the surfaces to be bonded are polished to a roughness in the order of atomic dimensions then cleaned to remove contaminants and particulates. The cleaned surfaces are then ion bombarded in a gas plasma to activate the surface. For many gases ($H_2$, $N_2$, $O_2$, $CF_4$, $SF_6$, $CF_4+O_2$, $SF_6+O_2$, etc.), there are conditions which yield some enhancement of bond energy, but sizeable increases have only been demonstrated for gases containing oxygen and/or fluorine. After ion bombardment with oxygen and/or fluorine, the activated surfaces are given a final water flush to remove any new particulates, dried, and then contact bonded. Subsequent heating enhances the bond energy between the contacted surfaces. The activation of the surfaces by oxygen ion bombardment has been found to increase the bond energy between the surfaces about 2 times that obtained without the oxygen ion bombardment. The addition of fluorine ions to the oxygen ion flux bombarding the surfaces to be reaction bonded can further enhance the bond energies by another factor of two to three.

Further advantages of activating the surfaces to be reaction bonded by oxygen ion and fluorine ion bombardment may be obtained from reading the specification in conjunction with the appended figures.

DETAILED DESCRIPTION OF THE PREFERRED EMBODIMENT

The invention is directed to enhancing the reaction bonding between $SiO_2$ or $Si_3N_4$ coated semiconductor materials such as silicon (Si), indium phosphide (InP), gallium arsenide (GaAr), glasses and any two surfaces that contain atoms which react with each other. The details of the process will be discussed relative to the flow diagram illustrated in FIG. 1. As indicated in block 10, the substrates are first polished so that their surface roughness is in the order of atomic dimensions. A surface roughness of the order of atomic dimensions is less than 2 nanometers and preferably less than one nanometer. The polished surface is then cleaned, as indicated by block 12, using standard cleaning methods established for cleaning semiconductor parts to remove contaminants and particulates from the surfaces to be reaction bonded. The use of hydrofluoric acid dips normally used in standard cleaning methods should be avoided for surfaces which may be etched by the hydrofluoric acid.

In the instances where the surface to be bonded is a thin oxide layer grown on the polished surface, it has been found that the thin oxide layer assumes the morphology of the polished substrate and does not have to be polished. Thin deposited films of reactive metals or insulators also follow the substrate morphology and can be bonded without further polishing.

Figure 2:
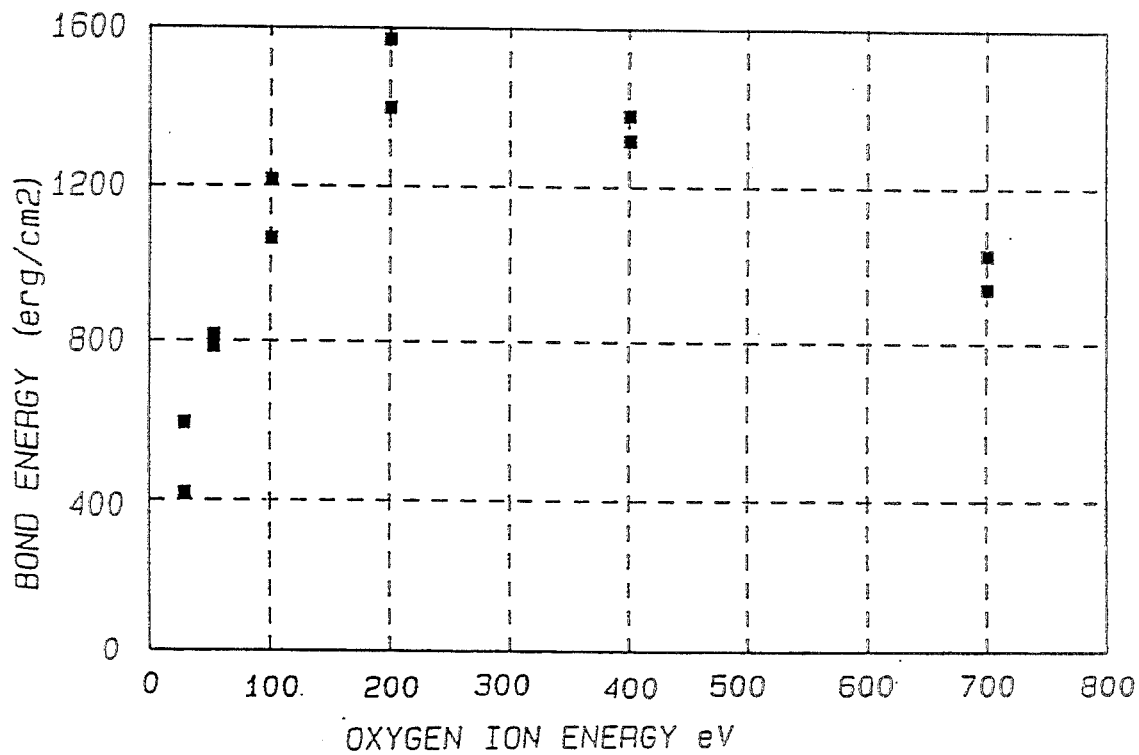
FIG. 2 is a graph showing the bond energy as a function of the energy of the oxygen ions.

The substrate is then placed in a vacuum chamber with an RF powered electrode. Normally, a pressure of approximately 50 millitorr within the vacuum chamber has been used, but it is expected that any pressure that can support an RF plasma is a possibility. An RF induced DC bias on the substrate accelerates the positive ions in the plasma toward the surfaces to be bonded with an energy determined by the magnitude of the bias. As can be seen in FIG. 2, the maximum bond energies for the conditions examined with an oxygen plasma, yielded maximum bond energies with 200 V bias. The bond energies dropped markedly for biases below 100 V. Plasmas with fluorine containing gases have yielded much higher bond energies with low DC bias. For example, a $SF_6$ plasma activation with a 14 V substrate bias yielded bond energies almost as large as a 200 V bias with an oxygen plasma activation. This difference can be critical when it is important to either minimize radiation damage in an insulator or minimize contamination due to sputtering in the chamber.

Figure 3:
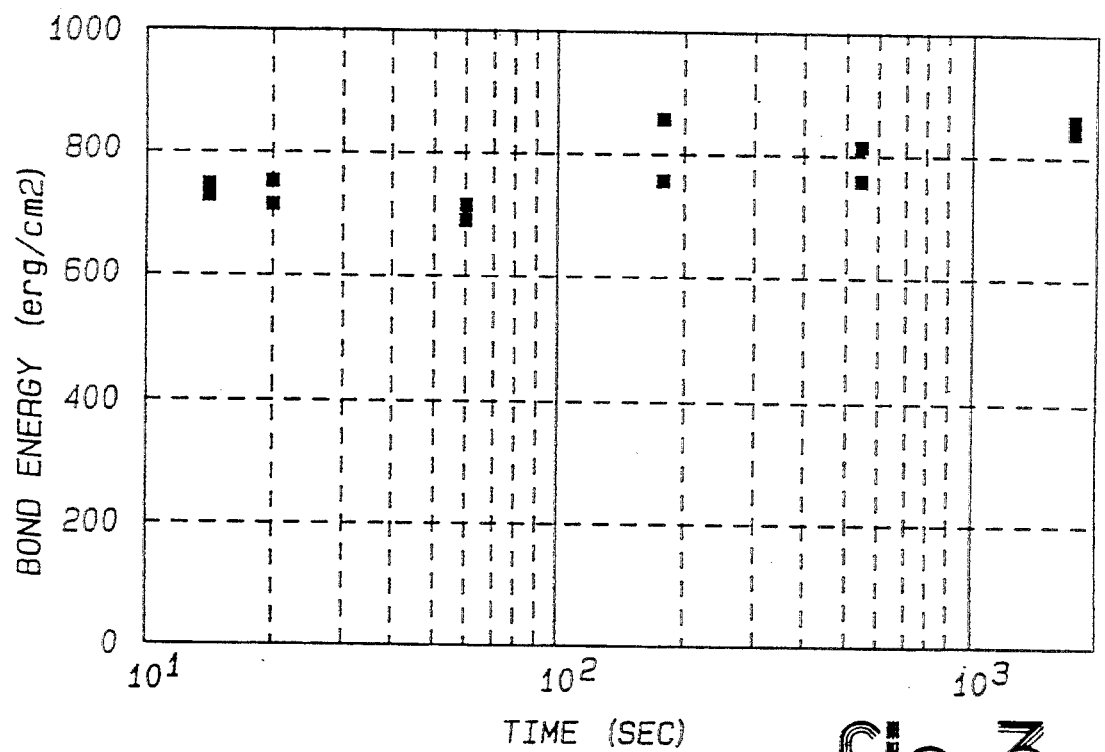
FIG. 3 is a graph showing the variation of bond energy as a function of bombardment time.

For bombardment energies above the value for maximum bond energies, there is little evidence that a total oxygen ion dose much greater than the number of surface atoms is of benefit. This is evident from the graph shown in FIG. 3, there is only a small difference in the resultant bond energies for an oxide exposed to a 400 eV oxygen ion flux as the ion bombardment time varied from 13 seconds to 1,800 seconds. The 13 second minimum bombardment time of FIG. 3 does not represent a lower limit but simply represents the minimum time limit of the ionization equipment used. Calculations indicate that an oxygen ion dose equivalent to the surface atom density of the substrate would be received by the surface in a time period in the order of one (1) second.

The method of producing the oxygen and fluorine ions may be a DC or RF voltage, or any other type of ionization mechanism known in the art.

Figure 4:
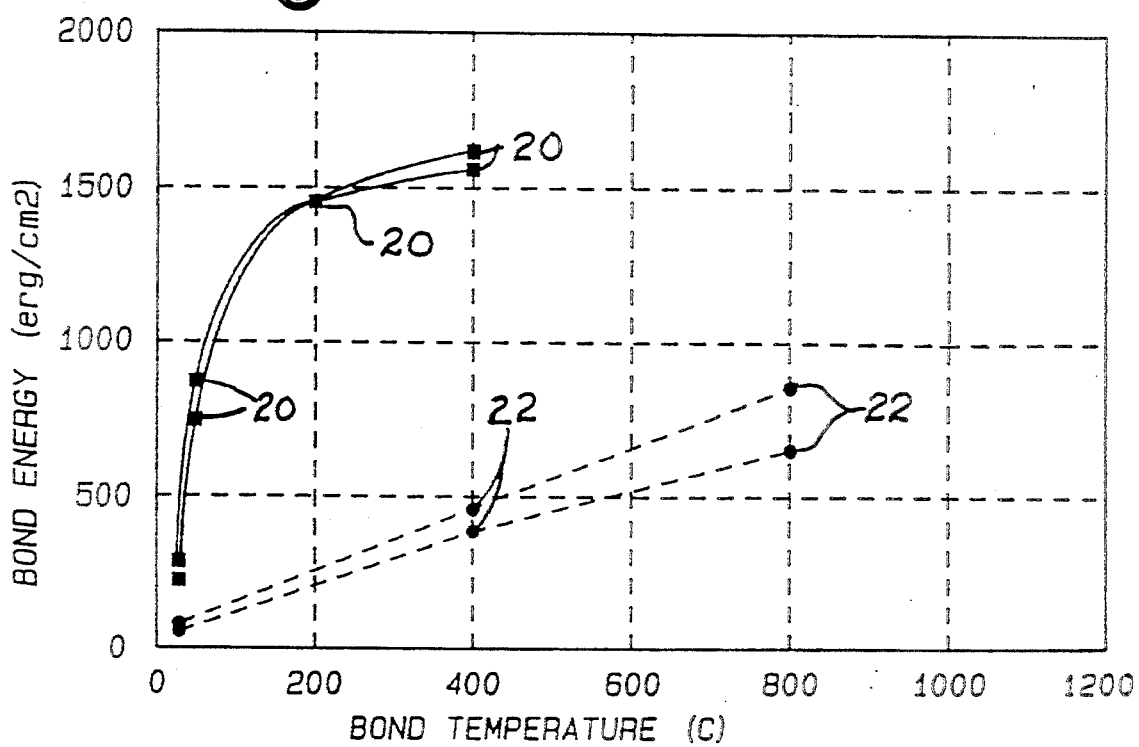
FIG. 4 shows an example of the difference in the bond energy of surfaces activated by oxygen plus fluorine ion bombardment and surfaces activated by water as a function of bond temperature.

After the surfaces to be bonded have been activated by oxygen ion bombardment, fluorine ion bombardment or a mixture of oxygen and fluorine ion bombardment, the surfaces are given a deionized water flush to remove any new particulates, dried, as indicated by block 15, then contacted to each other, as indicated by block 16. Heating to a predetermined temperature, as indicated by block 18, increases the bond energy. FIG. 4 shows the bond energies of the reaction bonded surfaces as a function of the temperature to which the bonded surfaces were heated after contacting at room temperature. The bond energies of the surfaces which have been activated by bombardment with a mixture of oxygen and fluorine ion are indicated by the blocks 20, while the range of bond energies of surfaces activated by a standard water activation process are indicated by the circles 22. As is evident from the data shown in FIG. 4, the bond energy for the surfaces activated by oxygen and fluorine ion bombardment are over 3 times greater than the bond energies of surfaces activated by the standard water activation over most of the bonding temperature range examined. Effectively, reaction bonded components in which the surfaces were activated by bombardment with oxygen ions, fluorine ions or a mixture of oxygen and fluorine ions, may be bonded at significantly lower temperatures.

Experiments conducted with activating the surfaces to be bonded with oxygen plus fluorine ion bombardment demonstrated that the addition of fluorine ions further enhances the activation of the surface and the resultant bond energy by a factor of approximately two to three over the bond energy obtained by oxygen ion bombardment without the addition of the fluorine ions. In general, the lower the bonding temperature, the greater the relative enhancement by fluorine ions. This trend holds down to room temperature with the results that some surfaces that are a little too rough or non-flat to be contacted with standard activation may be contacted after fluorine ion activation. Carbon tetrafluorine ($CF_4$), trifluoromethane ($CHF_3$) and sulfur hexafluoride ($SF_6$) have been used as a source of fluorine ions in the ion bombardment activation. When oxygen is mixed with the above gases, the oxygen not only supplies oxygen ions to bombard and react with the substrate surface along with fluorine ions, but it also reacts with the carbon in the $CF_4$ and $CHF_3$ gases or the sulfur in the $SF_6$ gas and frees more fluorine.

Figure 1:
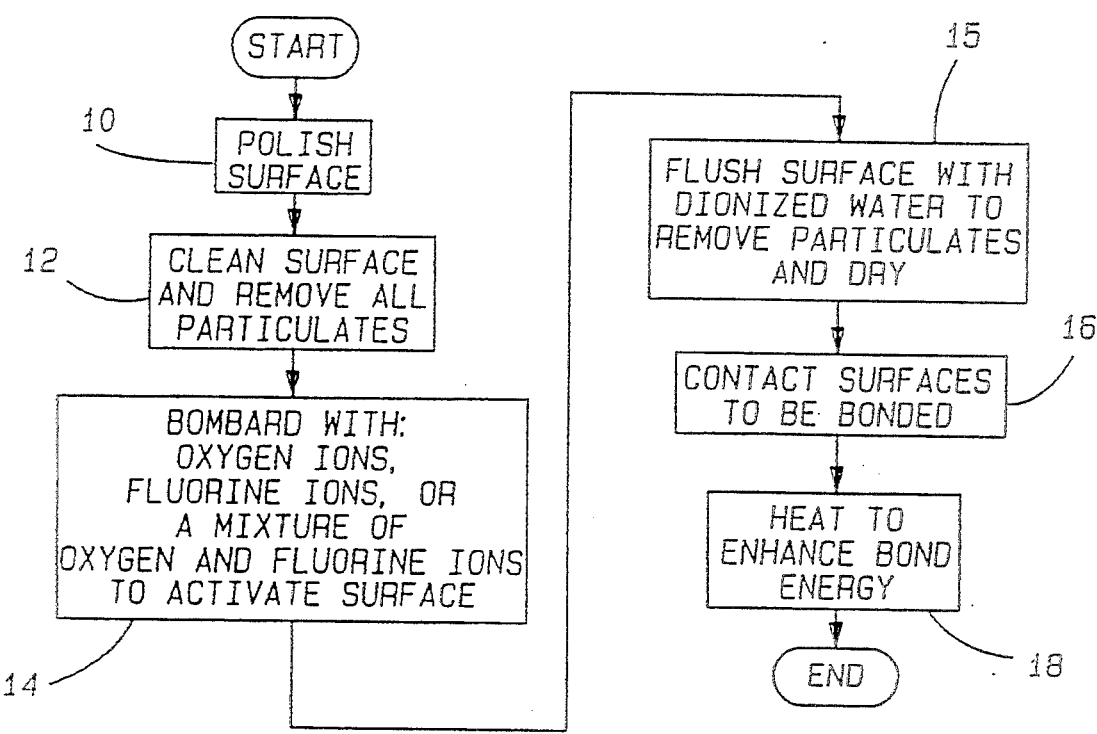
FIG. 1 is a flow diagram of the process for enhancing the bond energy of the surfaces to be bonded.

The procedure for activating the surface to enhance the bond energy using a mixture of oxygen and fluorine ions is the same as the procedure set forth in FIG. 1, with the exception that the surfaces are bombarded with both oxygen and fluorine ions as indicated in the bracketed part of block 14.

While the best mode for carrying out the invention has been described in detail, those familiar with the art to which this invention relates will recognize various alternative designs and embodiments for practicing the invention as defined by the following claims.

What is claimed is:

1. A method for enhancing reaction bonding between solid surfaces comprising the steps of:
   polishing each surface to be reaction bonded to have a maximum roughness of the order of atomic dimensions to produce polished surfaces;
   cleaning each of said polished surfaces to remove contaminants and particulates to produce cleaned surfaces;
   ion bombarding said cleaned surfaces to produce activated surfaces with ion selected from the group of ions consisting of oxygen ions, fluorine ions and a mixture of oxygen and fluorine ions; and
   contacting said activated surfaces to produce a contact bonded structure.

2. The method of claim 1 further including the step of heating said contact bonded structure to enhance the bond energy between said contacted activated surfaces.

3. The method of claim 1 wherein said step of polishing produces surfaces having a roughness of less than 10 nanometers.

4. The method of claim 1 wherein said step of ion bombarding includes the step of oxygen ion bombarding said cleaned surfaces using oxygen ions having an energy in the range from 150 to 400 eV.

5. The method of claim 1 wherein said step of ion bombardment includes the step of oxygen ion bombardment with oxygen ions having energies in the range from 200 to 300 eV.

6. The method of claim 1 wherein said step of ion bombardment includes the step of fluorine ion bombardment.

7. The method of claim 1 wherein said step of ion bombarding includes the steps of:
placing said surface in an ion bombardment chamber having a reduced pressure oxygen atmosphere;
adding a predetermined quantity of a gas containing fluorine to said oxygen atmosphere;
ionizing said oxygen and said gas containing fluorine to produce oxygen ions and fluorine ions; and
oxygen ion and fluorine ion bombarding said cleaned surfaces to produce said activated surfaces.

8. The method of claim 1 wherein said step of ion bombarding includes the steps of:
placing said surface in an ion bombardment chamber having a reduced pressure of a gas containing fluorine atmosphere;
ionizing said gas containing fluorine to produce fluorine ions; and
fluorine ion bombarding said cleaned surface to produce said activated surface.

9. A method for increasing the bond energy between two surfaces comprising the steps of:
polishing each of the surfaces to be reaction bonded to have a roughness less than a predetermined roughness;
cleaning said surfaces to remove contaminants and particulates which would interfere with reaction bonding;
placing said cleaned surfaces in an ion bombardment chamber having a reduced pressure oxygen atmosphere containing a predetermined quantity of a gas containing fluorine;
ionizing said oxygen and said gas containing fluorine to produce oxygen and fluorine ions;
accelerating said oxygen ions and said fluorine ions toward said surfaces with an energy in the range from 14 to 400 eV;
reacting said accelerated oxygen and fluorine ions with said surfaces to produce activated surfaces;
contacting said activated surfaces to produce a contact bond therebetween; and
heating said contacted surfaces to increase the contact bond energy between said activated surfaces.

10. The method of claim 9 wherein said step of placing includes the step of placing said surfaces in said ion bombardment chamber having a reduced pressure oxygen and carbon tetrafluoride atmosphere.

11. The method of claim 9 wherein said step of placing includes the step of placing said surfaces in said ion bombardment chamber having a reduced pressure oxygen and sulfur hexafluoride atmosphere.

12. The method of claim 9 wherein said step of polishing includes the step of polishing each surface to a roughness of the order of magnitude equal to atomic dimensions.

13. A method for increasing the reaction bond energy between two surfaces comprising the steps of:
polishing each of the surfaces to be reaction bonded to have a roughness less than a predetermined roughness;
cleaning said surfaces to remove contaminants and particulates which would interfere with reaction bonding;
placing said cleaned surfaces in an ion bombardment chamber having a reduced pressure atmosphere of a gas containing fluorine;
ionizing said gas containing fluorine to generate fluorine ions;
accelerating said fluorine ions toward said cleaned surfaces with a predetermined energy;
reacting said fluorine ions with said cleaned surfaces to produce activated surfaces; and
contacting said activated surfaces to produce a contact bond therebetween.

14. The method of claim 13 further comprising the step of
heating said contacted surfaces to increase the contact bond energy between said activated surfaces.

* * * * *